United States Patent
Segawa et al.

[11] Patent Number: 5,227,727
[45] Date of Patent: Jul. 13, 1993

[54] RADIO-FREQUENCY MAGNETIC FIELD REGULATING APPARATUS FOR MAGNETIC RESONANCE IMAGING

[75] Inventors: Toru Segawa, Utsunomiya; Junichi Makita, Tokyo, both of Japan

[73] Assignee: Kabushiki Kaisha Toshiba, Kawasaki, Japan

[21] Appl. No.: 809,730

[22] Filed: Dec. 17, 1991

[30] Foreign Application Priority Data

Jun. 20, 1991 [JP] Japan .................... 3-148856

[51] Int. Cl.⁵ .................................... G01R 33/20
[52] U.S. Cl. .................................... 324/318
[58] Field of Search ............ 324/300, 307, 309, 318, 324/322; 128/653.5, 653.2

[56] References Cited

U.S. PATENT DOCUMENTS

| | | | |
|---|---|---|---|
| 4,701,709 | 10/1987 | Yamamoto et al. | 324/312 |
| 4,713,614 | 12/1987 | Hoshino et al. | 324/307 |
| 5,113,865 | 5/1992 | Maeda et al. | 324/309 |

Primary Examiner—Michael J. Tokar
Attorney, Agent, or Firm—Limbach & Limbach

[57] ABSTRACT

Between at least one of a transmitting coil and a receiving coil and a subject to be examined is interposed a member containing a high molecular compound such as a molded sheet of nonconductive fiber or rubber, a PVA gel sheet or a PAR gel sheet. Thereby, the radio-frequency magnetic field distribution can be regulated with ease without adjusting hardware or software of a magnetic resonance diagnostic apparatus, thus permitting diagnosises to be made with high accuracy.

23 Claims, 9 Drawing Sheets

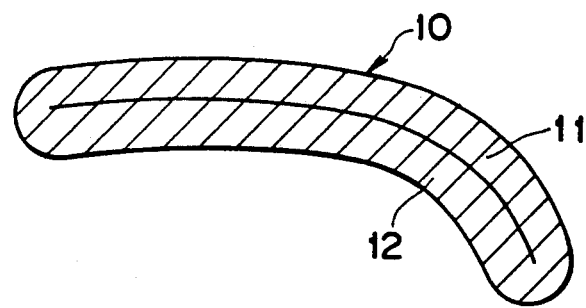
F I G. 2
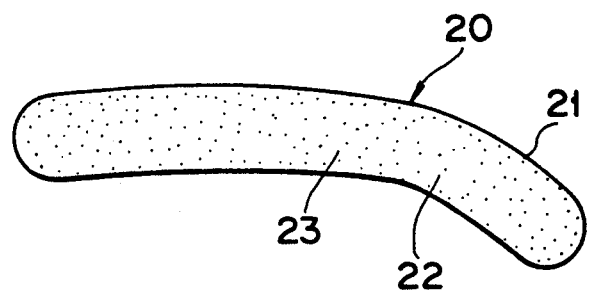
F I G. 3
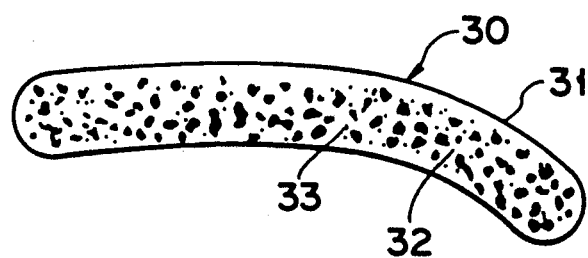
F I G. 4

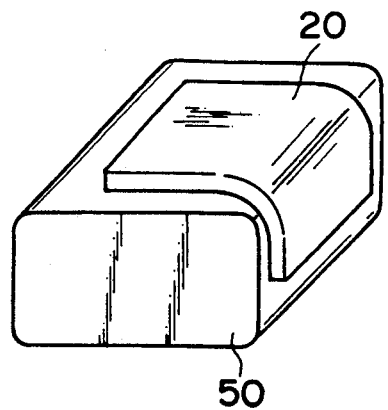
F I G. 11
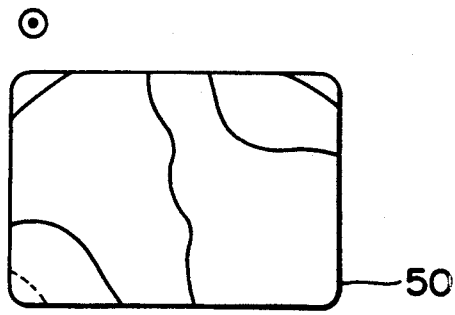
F I G. 12
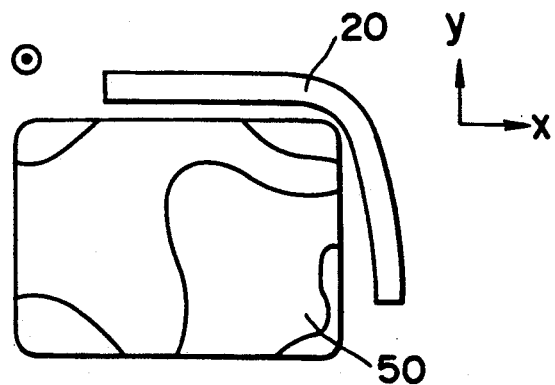
F I G. 13

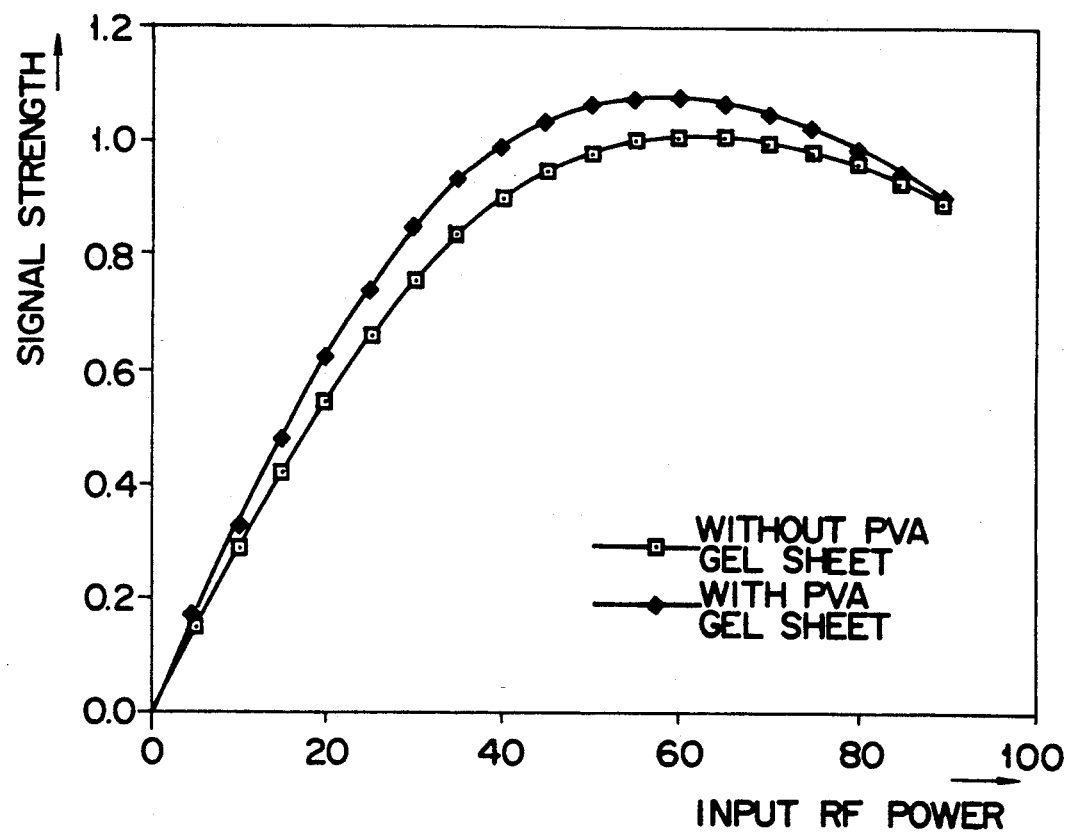
F I G. 16

RADIO-FREQUENCY MAGNETIC FIELD REGULATING APPARATUS FOR MAGNETIC RESONANCE IMAGING

BACKGROUND OF THE INVENTION

1. Field of the Invention

The present invention relates to a radio-frequency magnetic field regulating apparatus which is used as supplementary means in a magnetic resonance diagnostic apparatus such as a magnetic resonance imaging apparatus for obtaining morphological information of a subject to be examined (living organism) and a magnetic resonance spectroscopic imaging apparatus for obtaining spectroscopic functional information utilizing magnetic resonance phenomenon.

2. Description of the Related Art

The magnetic resonance phenomenon is a phenomenon in which atomic nuclei placed in a static magnetic field and having non-zero spins and magnetic moments absorb and emit electromagnetic-wave energy at specific resonant frequencies. The atomic nuclei are excited to resonance at the Larmor angular frequency given by $$\omega_0 = \gamma H_0$$

where $\gamma$ is the gyromagnetic ratio inherent in the atomic nuclei and $H_0$ is the strength of the static magnetic field.

The apparatus adapted to make in vivo diagnosis utilizing the above principle performs signal processing on electromagnetic waves having the same frequency as above and induced after the resonance absorption, thereby obtaining diagnostic information reflecting atomic nucleus density, longitudinal relaxation time T1, transverse relaxation time T2, flow, and chemical shifts on a noninvasive basis, for example, cross-sectional magnetic resonance images of an object to be examined.

To acquire diagnostic information utilizing magnetic resonance, the whole body of a human subject placed in a static magnetic field may be excited to acquire magnetic resonance signals from the whole body. In view of constraints on construction of apparatus and clinical requirements for magnetic resonance images, however, actual apparatuses are adapted to excite a specific body region of the subject and acquire magnetic resonance signals from the body region.

In this case, the specific imaging region is usually chosen to be a slice of a certain thickness. Magnetic resonance signals (MR signals) such as echo signals and FID signals are acquired by repeating a data encoding process many times. These data groups are subjected to, for example, two-dimensional Fourier transform for image reconstruction, thereby producing an cross-sectional MR image of the selected slice of the subject.

In the magnetic resonance imaging diagnostic technology, a specific body region is generally defined by a radio-frequency magnetic field (an RF pulse) produced by a radio-frequency magnetic field producing coil and gradient magnetic fields produced by gradient magnetic field producing coils.

In such a magnetic resonance diagnostic apparatus, when a diagnosis is made of, for example, the abdomen of a human subject, a radio-frequency magnetic field is produced by a whole-body radio-frequency magnetic field producing coil which is incorporated into the apparatus in order to exert influence of the radio-frequency magnetic field on a relatively wide range.

The subject to be examined is placed within a RF coil system such as a saddle-shaped whole-body coil. The position and thickness of a selected slice for diagnosis are determined by a radio-frequency magnetic field (an RF pulse) produced by the whole-body coil and gradient magnetic fields Gx, Gy and Gz produced by gradient magnetic field producing coils.

In this case, the spatial distribution of the radio-frequency magnetic field is determined by coil characteristics such as the coil pattern shape, the distribution and capacitances of distributed capacitors, etc., and the conductivity, dielectric constant, etc., of the subject to be examined. For this reason, when such a large coil (whole-body coil) is used, ununiformity will be produced in the radio-frequency magnetic field distribution because of the influence of the coil characteristics, etc. In addition, the spatial distribution of radio-frequency magnetic field will be distorted (become ununiform) within the subject because of its conductivity, permittivity, permeafility, and boundary condition depending on the radio-frequency magnetic field characteristics, produced by the coil. The phenomenon which is described become the difference of the spatial transmitting sensitivity at the transmitting and receiving sensitivity at the receiving. These factors could produce irregularities in sensitivity in obtained MR images. In a magnetic resonance imaging apparatus utilizing such a high magnetic field as 1.5T, in particular, the phase of magnetized spins is liable to vary because of movement phenomena such as the motion of the heart. In a high-magnetic-field magnetic resonance imaging apparatus, because the apparatus have the characterization is sensitive to vary since the spatial magnetic susceptibility, what is referred to as susceptibility artifacts become marked. The frequency value of the radio-frequency magnetic field for using reception and/or transmission, become large number (nealy 60 MHz), become to neglest the distortion of the radio-frequency magnetic field at the receiving based on the effect such as the shape of the subject, the conductivity and the dielectric constant. For example, when an abdomen is photographed by heart cine-photographing, the left ventricle heart muscle portion is blackened as indicated by oblique lines in FIG. 1 which is an axial sectional view of the abdomen, failing to make highly exact diagnosis.

In order to solve such a problem, it is required to partly control the radio-frequency magnetic field distribution in the space within the coil. For example, adjusting coil characteristics or transmit signals to be applied to the coil for each imaging condition may be conceived. However, this will require hardware or software to be adjusted for each imaging condition. Adjusting hardware or software for each imaging condition is too troublesome to be done practically.

SUMMARY OF THE INVENTION

It is therefore an object of the present invention to provide a radio-frequency magnetic field regulating apparatus for magnetic resonance diagnosis which permits the radio-frequency magnetic field distribution to be adjusted with ease without the necessity of adjusting hardware or software and thus exact diagnosis to be made.

The above object is attained by a radio-frequency magnetic field regulating device, which is used in a magnetic resonance diagnostic apparatus which produces a magnetic resonance phenomenon in a specific region of a subject to be examined placed in a static magnetic field by irradiating said subject with an excitation radio-frequency pulse from a transmitting coil and collecting magnetic resonance signals produced by the magnetic resonance phenomenon by using a receiving coil, thereby obtaining diagnostic information on said specific region, comprising a member interposed between at least one of said transmitting and receiving coils and said subject to be examined and having dielectric property.

The above object is also attained by a radio-frequency magnetic field regulating device, which is used in a magnetic resonance diagnostic apparatus which produces a magnetic resonance phenomenon in a specific region of a subject to be examined placed in a static magnetic field by irradiating said subject with an excitation radio-frequency pulse from a transmitting coil and collecting magnetic resonance signals produced by the magnetic resonance phenomenon by using a receiving coil, thereby obtaining diagnostic information on said specific region, comprising a member interposed between at least one of said transmitting and receiving coils and said subject to be examined and formed by molding a non-magnetic conductive metal into a predetermined shaped with a molding material.

Moreover, the above object is also attained by a radio-frequency magnetic field regulating device, which is used in a magnetic resonance diagnostic apparatus which produces a magnetic resonance phenomenon in a specific region of a subject to be examined placed in a static magnetic field by irradiating said subject with an excitation radio-frequency pulse from a transmitting coil and collecting magnetic resonance signals produced by the magnetic resonance phenomenon by using a receiving coil, thereby obtaining diagnostic information on said specific region, comprising a member interposed between at least one of said transmitting and receiving coils and said subject to be examined and formed by filling a bag with a non-magnetic conductive gel material.

Furthermore, the above object is also attained by a radio-frequency magnetic field regulating device, which is used in a magnetic resonance diagnostic apparatus which produces a magnetic resonance phenomenon in a specific region of a subject to be examined placed in a static magnetic field by irradiating said subject with an excitation radio-frequency pulse from a transmitting coil and collecting magnetic resonance signals produced by the magnetic resonance phenomenon by using a receiving coil, thereby obtaining diagnostic information on said specific region, comprising a bag interposed between at least one of said transmitting and receiving coils and said subject to be examined and filled with a high molecular compound impregnated with an inorganic electrolytic ion aqueous solution.

When, in the apparatus, a member containing a high molecular material, such as a molded sheet of nonconductive fiber or rubber with high permittivity, or conductive fiber or rubber with high conductivity a PVA gel sheet or a PAR gel sheet, is interposed between at least one of the transmitting coil and the receiving coil and the subject to be examined as a dielectric substance, it has confirmed that the radio-frequency magnetic field at at least one of the transmitting coil and the receiving coil is decayed or refracted. Thereby, the radio-frequency magnetic field distribution near the member containing the high molecular material is distorted, thus permitting the radio-frequency magnetic field distribution to be regulated easily without adjusting hardware and software of the magnetic resonance diagnostic apparatus. In addition, the radio-frequency magnetic field distribution can be regulated flexibly by the action of the dielectric substance.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a sectional view of a radio-frequency magnetic field regulating device, which is the principal part of the invention, according to a first embodiment of the present invention (conductive sheet molded by a sheet made of nonconductive fiber or rubber);

FIG. 3 is a sectional view of a radio-frequency magnetic field regulating device, which is the principal part of the invention, according to a second embodiment of the present invention (PVA gel sheet);

FIG. 4 is a sectional view of a radio-frequency magnetic field regulating device, which is the principal part of the invention, according to a third embodiment of the present invention (PAR gel sheet);

FIG. 11 illustrates in perspective a state in which a PVA gel sheet is adhered to an oil phantom;

FIG. 12 illustrates the signal strength distribution within an oil phantom when no PVA gel sheet is adhered thereto;

FIG. 13 illustrates the signal strength distribution within an oil phantom when a PVA gel sheet is adhered thereto;

DETAILED DESCRIPTION OF THE PREFERRED EMBODIMENTS

Figure 1:
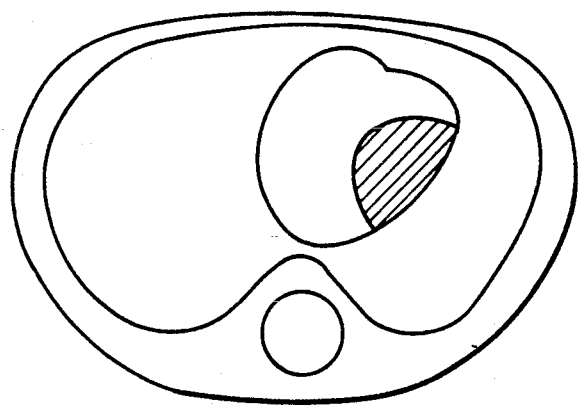
FIG. 1 illustrates an axial cross-sectional image for use in explanation of problems in a prior art.

Hereinafter, a description will be made of preferred embodiments of a radio-frequency magnetic field regulating device adapted for magnetic resonance diagnosis according to the present invention with reference to FIGS. 2 through 4 which illustrate the principal part thereof.

Referring to FIG. 2, a radio-frequency magnetic field regulating device 10, which is a dielectric molded sheet made of a high molecular compound such as a nonconductive fiber or rubber, is formed by molding a non-magnetic conductive metal 11 in the shape of foil or RF-shielding mesh sheet into a prescribed shape such as a cushion with a molding material 12. The properties required of the molding material 12 are flexibility, electric insulation, moistureproofing, etc. Typical examples of molding materials which satisfy these properties are high molecular compounds such as a nonconductive fiber, rubber, etc.

A radio-frequency magnetic field regulating device (PVA (poly-vinyl alcohol gel) sheet) 20 illustrated in FIG. 3 is formed of a bag 21 filled with a non-magnetic conductive gel material 22. The properties required of the bag are flexibility, electric insulation, moisture-proofing, etc. A high molecular compound such as rubber is a typical example of material for the bag. The non-magnetic conductive gel material is formed of polyvinyl alcohol (PVA), which is still a high molecular compound, impregnated with an inorganic electrolytic ion water solution containing ions such as $Na^+$, $K^+$, $Ca^{2+}$, $Cl^-$, etc.

A radio-frequency magnetic field regulating device (PAR gel sheet) 30 shown in FIG. 4 is formed of a bag 31 filled with a polyacrylic resin (PAR), which is still a high molecular compound, impregnated with an inorganic electrolytic ion solution containing ions such as $Na^+$, $K^+$, $Ca^{2+}$, $Cl^-$, etc.

Figure 5:
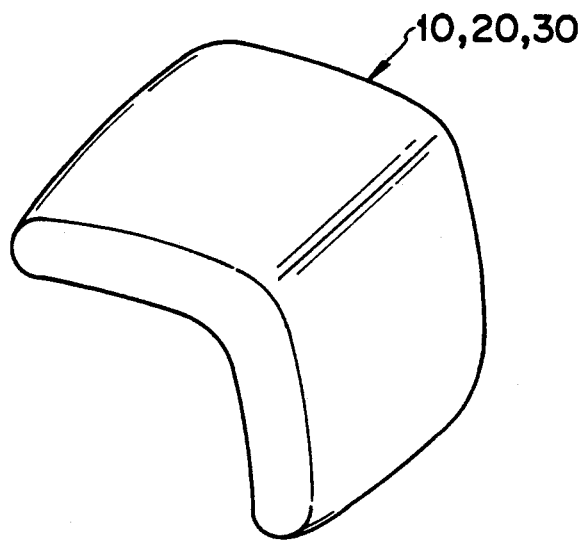
FIG. 5 is a perspective view of the radio-frequency magnetic field regulating device illustrated in FIG. 2, 3 or 4.
Figure 6:
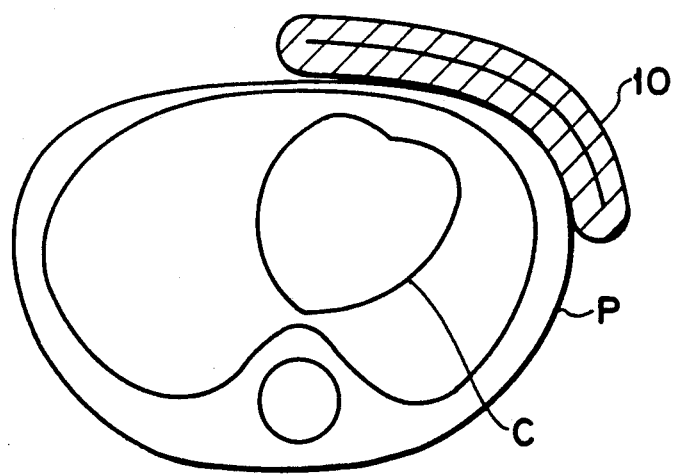
FIG. 6, illustrates a way of using the radio-frequency magnetic field regulating device according to the first embodiment.
Figure 7:
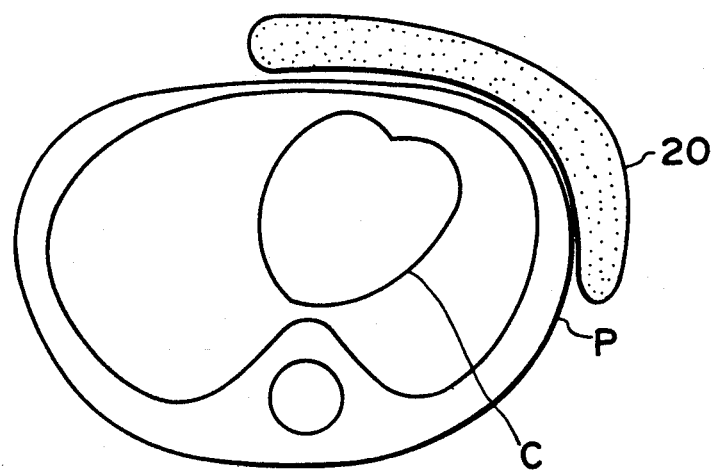
FIG. 7 illustrates a way of using the radio-frequency magnetic field regulating device according to the second embodiment.
Figure 8:
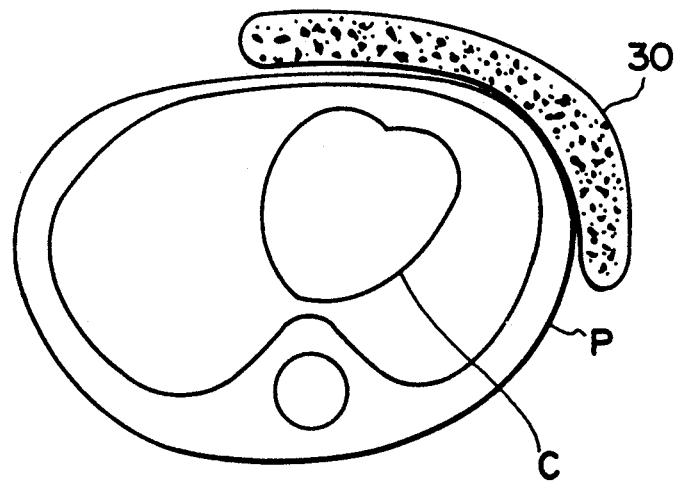
FIG. 8 illustrates a way of using the radio-frequency magnetic field regulating device according to the third embodiment.

The radio-frequency magnetic field regulating devices 10, 20 and 30, having flexibility, can be formed into an arbitrary shape as shown in FIG. 5 and thus can be placed in contact with the abdomen of a human subject not shown. For example, FIG. 6 illustrates a situation in which the the radio-frequency magnetic field regulating device (high molecular gel sheet) 10 is put to the side of the abdomen of the human subject P, and FIG. 7 illustrates a situation in which the radio-frequency magnetic field regulating device (PVA gel sheet) 20 is put to the side of the abdomen of the human subject P. FIG. 8 illustrates a situation in which the radio-frequency magnetic field regulating device (PAR gel sheet) 30 is put to the side of the abdomen of the human subject P.

Next the function of the magnetic field regulating devices constructed as described above will be described. Suppose now that, as shown in FIGS. 6 through 8, the human subject P is placed in a gantry of magnetic resonance diagnostic apparatus such as magnetic resonance imaging apparatus and subjected to a static magnetic field, gradient magnetic fields and an excitation radio-frequency magnetic field. Suppose that the magnetic field regulating device is put to the side of the abdomen of the human subject P. When, under this condition, an excitation radio-frequency magnetic field is emitted from a whole-body coil, a radio-frequency magnetic field distribution will be obtained which differs from that would be obtained in the absence of the radio-frequency magnetic field regulating device.

Figure 9:
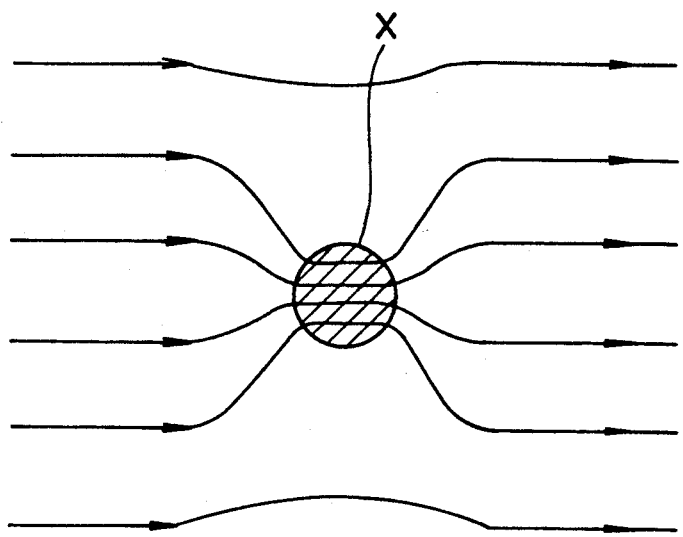
FIG. 9 illustrates one characteristic of a magnetic field and a specific substance.
Figure 10:
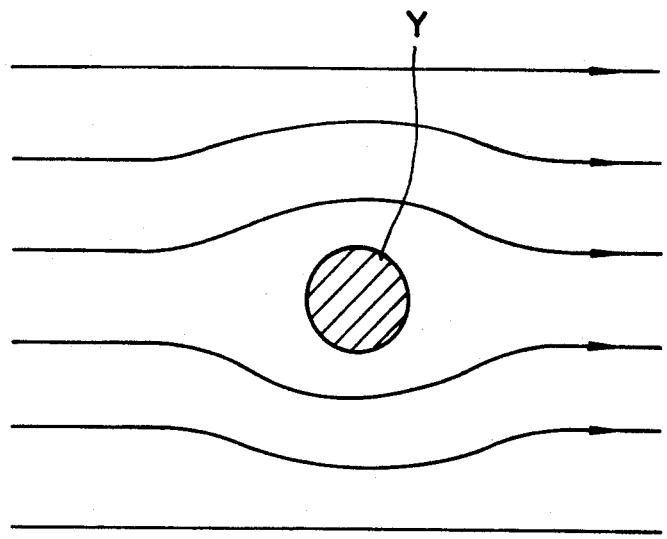
FIG. 10 illustrates another characteristic of a magnetic field and a specific substance.

Hereinafter, the function of the devices of the present invention of regulating the radio-frequency magnetic field distribution and other functions accompanying the regulating function will be described. First, the magnetic field characteristics will be described with reference to FIGS. 9 and 10. FIG. 9 illustrates a case where a ferromagnetic substance X is placed in a static magnetic field B, while FIG. 10 illustrates a case where a perfectly diamagnetic substance Y is placed in a static magnetic field B. In either case, regions which differ in magnetic flux density are produced around the substance. That is, magnetic field distortion is produced. The present invention applies the principle of the magnetic field distortion to the radio-frequency magnetic field and utilizes it. If a dielectric substance is placed in the RF magnetic filed, the RF magnetic field distribution will become like FIG. 9. And if a conductive substance is placed in the RF magnetic field, its distribution will become like FIG. 10. Since the radio-frequency magnetic field regulating device 1 has the non-magnetic conductive metal 11 in the shape of foil or RF-shielding mesh sheet and the radio-frequency magnetic field regulating devices 20 and 30 contain an electrolytic substance, it is considered that eddy currents are produced, a state close to the state shown in FIG. 10 results, the radio-frequency magnetic field near the region where RF magnetic field regulating device is placed is distorted and a region where the flux density of the radio-frequency magnetic field is high exists. Alternatively, it is also considered that, depending on the concentration of the electrolytic aqueous solution, the dielectric property of the gel sheet (PVA gel sheet, PAR gel sheet) becomes so dominant that the gel sheet behaves like a type of lens toward the radio-frequency wave and the flux density of the radio-frequency magnetic field near the sheet increases because of the effect of refraction. In discussion of the electromagnetic waves theory, the described phenomenon is applied to the far-field and is not always applied to the near-field such as a MRI system. But, the similar phenomenon may be applied to the near-field.

The above-mentioned radio-frequency magnetic field distortion will affect the spin excitation which is a factor of the magnetic resonance phenomenon. Therefore, the signal strength and contrast will also differ locally because a high RF magnetic field region and a low RF magnetic field region, produced by the radio-frequency magnetic field distortion, differ from each other in parameters such as a flip angle, etc.

As described above, even in the case where distortion occurs in the distribution of the excitation radio-frequency magnetic field produced by the wholebody coil, the influence of the RF magnetic field distortion can be canceled out by the magnetic field distorting action of the RF magnetic field regulating device which is put to the human subject P suitably, and parameters, such as a flip angle, etc., can be set to assume values under the proper field distribution, thus permitting an exact diagnostic image to be obtained. It is to be noted that, in this case, the necessity of adjusting hardware or software is obviated. For example, even if the abdomen is photographed by the heart cine-photographing, the left ventricle heart muscle can be photographed without being blackened, permitting exact diagnosis to be made.

Moreover, in a region where the flux density increases, in particular, the signal sensitivity at the time of signal reception can be increased. By attaching the radio-frequency magnetic field regulating device to the transmitting coil or receiving coil, control of the transmit radio-frequency magnetic field and the spatial control of the receive sensitivity can be performed.

Furthermore, the radio-frequency magnetic field regulating device according to the present invention, having flexibility, can be put to the human subject P properly, thus displaying the magnetic field regulating function for a desired region.

In addition, the magnetic field regulating device, having moistureproofing property, is sanitary and desirable as medical equipment.

Next, causes of the improvement in MR images produced by the gel sheets (PVA gel sheet and PAR gel sheet) of the present invention using a high molecular compound, which were investigated by the inventors of this application, will be described in detail.

(A) Introduction

In general, it is sometimes said that a magnetic resonance imaging apparatus having a static magnetic field strength of the order of 1.5T seems to have greater ability of making diagnosis of viscera for a human subject who has a thick layer of fat than for a human subject having a thin layer of fat. It has therefore been expected that diagnostic images of a human subject having a thin layer of fat are improved by putting a sheet member substituting for a fat layer to part of the human subject. Actually, by putting a gel sheet impregnated with electrolytic solution to part of the breast in imaging the heart, it has become possible to display soft tissues of the heart-wall and breastwall clearly.

In phantom experiments, on the other hand, increase of signal values in the neighborhood of the gel sheet impregnated with electrolytic solution has been confirmed with good reproducibility.

It is uncertain whether the two phenomena are caused by one cause, but it seems that there is some relation between them. At first these phenomena were realized by the use of a PVA gel sheet, but it was confirmed thereafter that the electrolytic solution was also effective. This method using electrolytic solution is very effective in making diagnosis of the heart using a magnetic resonance imaging apparatus, and application of the method to control of the transmitting and receiving efficiency of the RF coil in a magnetic resonance imaging apparatus is expected.

Diagnostic modalities for breast and abdomen include fluoroscopic apparatuses, X-ray CT scanners, magnetic resonance imaging apparatuses, etc. Heretofore, many diagnosises were made by fluoroscopic apparatuses using contrast media. However, recent development of hardware and software of magnetic resonance imaging apparatuses has made significant improvements in diagnostic ability even if contrast media are not used. Nevertheless, magnetic resonance imaging apparatuses need a relatively long photographing time at present and thus are weak in photographing of internal organs undergoing movements. It is said that this defect becomes more serious as the field strength becomes higher. With a magnetic resonance imaging apparatus having a static magnetic field strength of 1.5T, by way of example, the heart-wall is seldom displayed even if the heart is photographed in synchronization with the heart action.

It is said that magnetic resonance images of the abdomens of human subjects each having a thick layer of fat generally provide good imaging diagnosis. Then, by putting to the abdomen of a human subject having a thin layer of fat like PVA (Poly-Vinyl Alcohol) which is a substance that is close in composition to the human body from the aspect of magnetic resonance image acquisition, a like effect was remarkably obtained as expected at the time of cine-photographing of the heart, in particular.

(B) Phantom Experiments on MR Signal Strength

From cine-photographed images of the heart by magnetic resonance imaging using a PVA (Poly-Vinyl Alcohol) gel and a PAR (Poly-Acryl Resin) gel which are high molecular gels were obtained the following results:

(1) The strength of signals from the body near the high molecular gel sheet increased.
(2) The ability of extracting the heart-wall was improved.

Of the above clinical effects the signal strength increasing effect in (1) will be considered herein.

In general, MR signal strength depends on static magnetic field strength Ho, radio-frequency magnetic field strength Hl, receiving coil sensitivity, relaxation times T1 and T2 and temperature T. Thus, causes of the signal increasing effect were investigated by the following phantom experiments.

(a) Experimental Conditions

As a high molecular gel sheet use was made of a PVA gel sheet 340 mm long by 260 mm wide by 20 mm thick. The phantom is needed only for the purpose of measuring MR signal strength changes which depend on the presence or absence of the high molecular gel sheet. For this reason, use was made of a phantom (oil phantom) filled with oil which is a light load for the RF coil and little affected by ununiformities in signal strength resulting from the phantom itself due to eddy currents in order that the shape and size dependence may be neglected. As the RF coil use was made of a linear whole-body coil for transmission and reception. Before starting the experiment, 50 Ω of the RF coil was performed and 90-degree and 180-degree conditions of RF pulses were adjusted under a condition in which only the oil phantom was set. During the experiment these conditions were not altered at all except that 50 Ω matching of the RF coil was performed at each photographing.

In the case of clinical photographing, a change of the Q value of the RF coil due to the presence or absence of the high molecular gel sheet is so small that it cannot be measured. In the phantom experiment as well, a change of the Q value of the whole-body RF coil due to the presence or absence of the high molecular gel sheet was made as small as possible with adequate consideration for the setting condition of the high molecular gel sheet upon the RF coil. Of course, MR signals from the oil phantom are lowered considerably when RF is shielded by the big enough high molecular gel sheet with electrotytic solution so that the Q value of the RF coil is lowered.

First, under a condition that non-electrolytic oil is placed at the center of a magnet, measurement was taken of changes of the signal value distribution of oil images obtained when the PVA gel sheet was placed with the direction of $H_1(r)$ and the large surface of the sheet parallel to each other and when the gel sheet was placed with the direction of $H_1(r)$ and the large surface perpendicular to each other.

(b) Confirmation of Signal-Value Increasing Effect

To confirm whether signal values also increase in the neighborhood of the PVA gel sheet in the phantom experiment under a setting condition close to the clinical condition, oil phantom 50 somewhat smaller than the human body was used. Changes of signal values and sensitivity distribution of the oil phantom 50 when a PVA gel sheet 20 was put to the phantom in a state close to the real use condition (refer to FIG. 11) were measured from images. First, the image signal increasing effect of the oil phantom in the neighborhood of the PVA gel sheet placed to cover a side of the oil phantom measuring 260 mm × 260 mm × 180 mm was measured. FIG. 12 illustrates lines each connecting points of equal signal value on a cross-sectional image of the oil phantom, which is orthogonal to the z axis, obtained without the PVA gel sheet. FIG. 13 illustrates lines each connecting points of equal signal value on a cross-sectional image obtained in the presence of the PVA gel sheet. From FIG. 13 it will be seen that the signal value distribution in the oil phantom near the PVA gel sheet changes in a direction in which signal values increase. Geometrical transformation of the phantom image is not found, depending on the presence or absence of the high molecular gel sheet. Thus, it is not considered that the static magnetic field H changes locally.

(c) Quantitative Evaluation of Signal Value Increase in Phantom

In the phantom experiment in (b), the MR signal strength changes spatially and thus it is difficult to set a region of interest (ROI) where signal strength is measured.

To evaluate increase of signal strength quantitatively and reproducibly on the basis of a relatively uniform image, an experiment is performed in which an oil phantom, which is small enough as compared with the transmitting and receiving whole-body coil, is surrounded with the present sheet. Of course, a change of the Q value of the whole-body coil due to installation of the sheet is below the limit of measurement.

The phantom used actually is a bottle (a container is about 1 mm in wall thickness and made of plastics) which has a diameter of 60 mm and a length of 100 mm and is filled with oil. At the time of acquiring of images the phantom is placed at the center of the magnetic resonance imaging apparatus with its axis coincident with the axis (z axis) of the static magnetic field. To examine the effect of the PVA gel sheet, the PVA gel sheet is wound around the bottle-shaped phantom and the central axis of the phantom is made coincident with the central axis of the static magnetic field. In this state, a cross-sectional image perpendicular to the z axis was photographed and then the change of signal value in the obtained image was examined. Here, since the oil phantom is small enough as compared with the transmitting and receiving whole-body coil and placed at the center of the coil, the $H_1(r)$ distribution in unloaded state in that region is regarded as uniform.

(c-1) About Change of Relaxation Times

To confirm that there is no change of the relaxation times of the phantom solution (oil) regardless of the presence or absence of the high molecular gel sheet, the relaxation times T1 and T2 were measured. Here, to remove the effect of a 180-degree pulse, the measurement was made using the field echo method (gradient echo method, hereinafter abbreviated to FE method). As a result, no significant change was found in the relaxation times of the oil, regardless of the presence or absence of the PVA gel sheet. Namely, T1 was 149 (msec) and T2* was 42.5 (msec) in the absence of the PVA gel sheet. T1 was 150 (msec) and T2* was 42.3 (msec) in the presence of the PVA sheet.

(c-2) Measurement of Change of Local Radio-Frequency Magnetic Field Distribution The presence or absence of a relationship between the high molecular gel sheet and the radio-frequency magnetic field $H_1(r)$ can be understood by whether the extent of the signal value increasing effect is actually changed by placing the sheet in the direction of $H_1(r)$. It was confirmed that, even in a region positioned near and immediately behind the sheet, the signal value increases more when the PVA gel sheet was placed perpendicular to $H_1(r)$ than when the gel sheet was placed parallel to the $H_1(r)$. These phenomenon suggests that $H_1(r)$ takes part in increase of the signal values.

In the FE method, changing a flip angle set by software is equivalent to changing RF input power to the transmitting coil. In the FE method, sweeping RF input power to the transmitting coil permits the radio-frequency magnetic field strength produced by the coil to be varied, which is reflected in the flip angle $\theta$.

In general, the MR signal strength S obtained by the FE method is given by $$S \propto \frac{(1 - e^{-TR/T1})\sin\theta}{1 - e^{-TR/T1}e^{-TR/T2}\cos\theta(e^{-TR/T1} - e^{-TR/T2})} e^{-TE/T2*}$$

where T1 = longitudinal relaxation time, T2 = transverse relaxation time, T2* = apparent transverse relaxation time due to ununiformity of static magnetic field, TR = repetition time and TE = echo time.

When a graph of this expression is drawn with transmission power to the RF coil taken as abscissa and signal strength as ordinate, a peak value will be obtained at a certain angle $\theta$.

Figure 14:
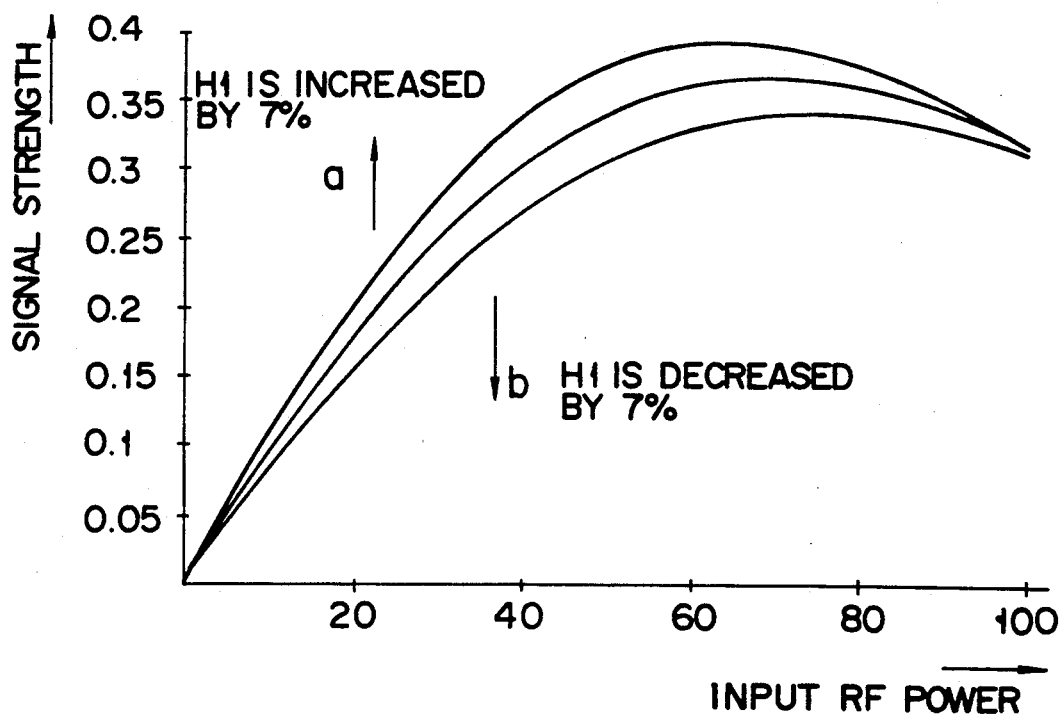
FIG. 14 is a graph illustrating input RF power versus signal strength curves when a PVA gel sheet is adhered and not adhered, and a single coil using both as a transmitting coil and a receiving coil is applied.

First, images are acquired using the above-mentioned bottle-shaped oil phantom with the software-set flip angle changed each time an image is photographed. Next, after the PVA gel sheet has been wrapped around the oil phantom, images are likewise acquired with the software-set flip angle changed at each photographing. In this case, changing the software-set flip angle corresponds to changing radio-frequency power input to the transmitter coil. If the PVA gel sheet serves to increase the radio-frequency magnetic field strength of its vicinity, a graph when the gel sheet is not present will shift in the direction of an arrow a of FIG. 14. Conversely, when it serves to decrease the magnetic field strength, the graph shifts in the direction of an arrow b of FIG. 14.

Figure 15:
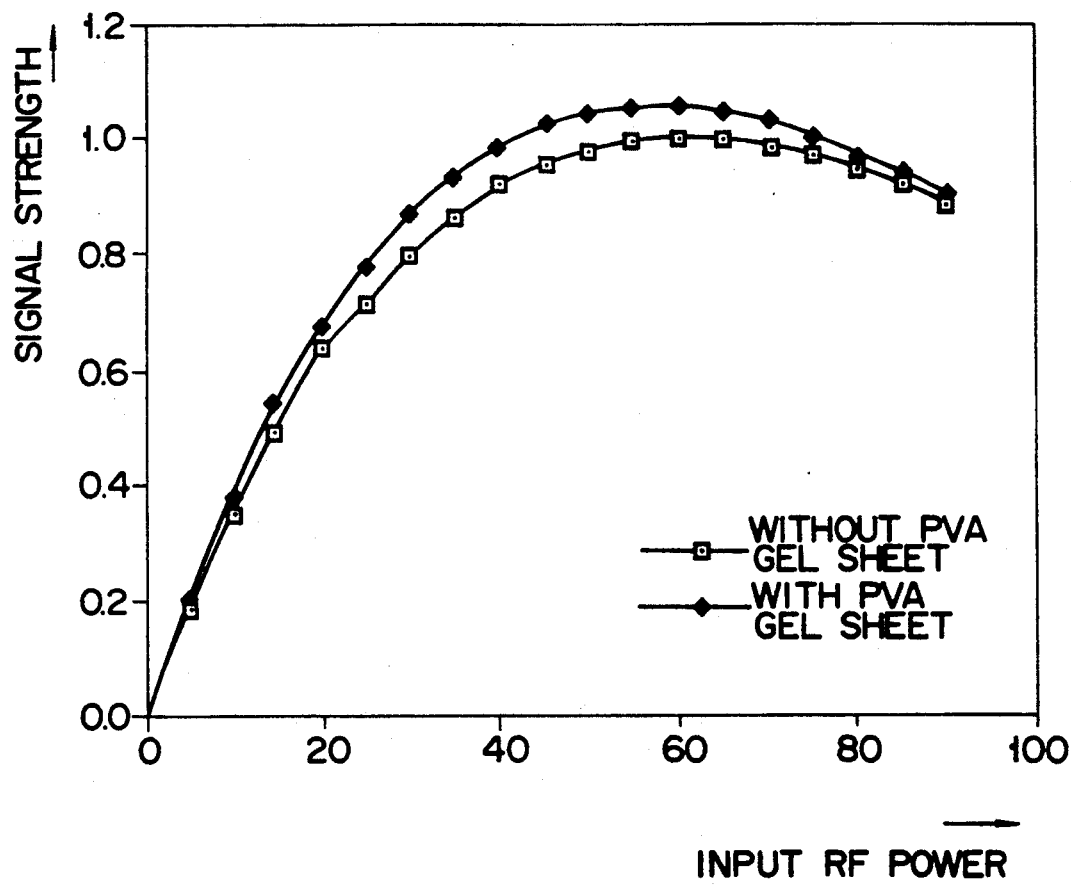
FIG. 15 is a graph illustrating experimental results of input RF power versus signal strength curves when a PVA gel sheet is adhered, and a single coil using both as a transmitting coil and a receiving coil is applied; and, FIG. 16 is a graph illustrating calculated results of input RF power versus signal strength curves when a PVA gel sheet is adhered, and a single coil using both as a transmitting coil and a receiving coil is applied.

FIG. 15 is a graph obtained by plotting signal values of the oil phantom while images are actually taken by the FE method (TR = 45 msec, TE = 9 msec) with the radio-frequency power to the transmitter coil changed. This graph agrees well with the graph of FIG. 14 in the case where the radio-frequency magnetic field strength $H_1(r)$ of the vicinity of the PVA gel sheet increases. A graph when it is supposed that $H_1(r)$ is increased by 7% by the PVA gel sheet will become as shown in FIG. 16 on calculation from expression (1) and agrees with the graph of FIG. 15 obtained by experiments. It is therefore anticipated that signal values of the vicinity of the PVA gel sheet are increased by the change of the local radio-frequency magnetic field distribution due to installation of the gel sheet.

(c) Considerations

Considerations based on experimental results (c-1) It is considered that there is no change of the static magnetic field Ho in the vicinity of the high molecular gel sheet because no geometrical image distortion is found in the vicinity of the gel sheet as shown in FIG. 13. It is therefore considered that the change of signal values of the phantom is not due to the change of the static magnetic field.

(c-2) It is considered that the increase of signal values of the phantom is not due to change of the relaxation times because it is clear from the measurements of the relaxation times in (c) that no change occurs in the relaxation times of the phantom near the high molecular gel sheet.

(c-3) Even if the signal value increasing effect is produced by a significant difference between gel sheet and patient temperatures which cause, the changes of the local body temperature of the patient. We cannot intepert the next phenomena. The phantom having little temperature difference also produced the signal value increasing effect. And also it is impossible for sudden temperature change to occur in the depth of the patient during a short period of photographing. It is therefore considered that the increase of signal values is not due to temperature change in the phantom.

(c-4) From the experiments by which the radio-frequency power to the transmitting coil is changed each time an image is photographed, it is considered that the phantom signal values increase because the transmission and reception efficiency increases due to the change of the radio-frequency magnetic field distribution that the transmitting and receiving coil has and the radio-frequency magnetic field strength increases in the vicinity of the high molecular gel sheet.

As described above, through the cause of image-quality improving effect due to the PVA and PAR gel sheets is not clear at present, it is considered that the radio-frequency magnetic field takes some part in these phenomena. It is expected that conditions exist in which these effects are produced markedly by making the concentration of an electrolytic ion aqueous solution impregnated into the gel sheet most suitably. There is a possibility that it depends on which of dielectric property or conductive property of the gel sheet containing an electrolytic ion aqueous solution is dominant. In general, the following reports have been made on magnetic resonance imaging.

(c-5) When a dielectric substance is interposed between a whole-body RF coil and an RF shield, the number of RF waves in the z direction increases and the number of waves in the x or y direction decreases relatively. Thus, the wavelength of RF waves incident on human body becomes long.

(c-6) When the mode of resonance of a type of dielectric resonator based on the dielectric property of the human body is changed, the signal strength distribution is subjected to change.

(c-7) RF waves incident on an substance which contains electrolytic ion aqueous substance placed in a static magnetic field transmit through a gel sheet with their phases and magnitude changed by eddy currents within the sheet and the boundary condition also changes the direction of the RF wave. Conversely, MR signals ar also affected by the static magnetic field and the eddy currents, so that they are likewise subjected to changes in strength, direction and phase.

It is considered at present that there is a possibility that these reports include one which can explain the cause of the image quality improving effect in the present case. There is also a possibility that a state of deflection is changed by the fact that RF waves generally have two types of indices of refraction within a substance because of anisotropy of high molecular gel sheets.

(D) Conclusion

Clinically, by putting a PVA gel sheet or a PAR gel sheet to the breast of a patient and cine-photographing his or her heart, signal values of the breast-wall near the sheet increase and heart muscle on the rear-wall side are displayed clearly. The signal value increasing effect in the vicinity of the sheet was measured with good reproducibility as 6 to 7% increase of signal values in the phantom experiments as well.

Supposing that the radio-frequency magnetic field strength is locally increased by 6 to 7% in the vicinity of the sheet, the rate of improvement in the efficiency of transmitting a radio-frequency magnetic field to a region near the sheet and the reception efficiency is observed to be 6 to 7% from a graph indicating changes of signal strength of the phantom when radio-frequency power input to the transmitting coil is swept in the FE method. The rate agrees with the result expected from calculations.

It is considered from these results that the image quality improving effect due to the PVA and PAR gel sheets results from increase of local radio-frequency magnetic field strength based on change of the radio-frequency magnetic field distribution.

According to the present invention, as described above, the radio-frequency magnetic field distribution can be regulated easily without adjusting hardware or software of a magnetic resonance diagnostic apparatus, thus providing a radio-frequency magnetic field regulating device for magnetic resonance diagnosis which permits highly exact diagnosises.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. For use in a magnetic resonance diagnostic apparatus which produces a magnetic resonance phenomenon in a specific region of a subject to be examined placed in a static magnetic field by irradiating said subject with an excitation radio-frequency pulse from a transmitting coil and collecting magnetic resonance signals produced by the magnetic resonance phenomenon by using a receiving coil, thereby obtaining diagnostic information on said specific region, a radio-frequency magnetic field regulating device comprising a member interposed between at least one of said transmitting and receiving coils and said subject to be examined and having dielectric property.

2. A radio-frequency magnetic field regulating device according to claim 1, in which said member includes a conductive substance.

3. A radio-frequency magnetic field regulating device according to claim 1, in which said member includes an electrolytic aqueous solution.

4. A radio-frequency magnetic field regulating device according to claim 1, in which said member comprises a high molecular material containing an electrolytic aqueous solution.

5. A radio-frequency magnetic field regulating device according to claim 4, in which said electrolytic aqueous solution is an inorganic ion aqueous solution such as $Na^+$, $K^+$, $Ca^{2+}$ or $Cl^-$.

6. A radio-frequency magnetic field regulating device according to claim 4, in which said high molecular gel material is a poly-acryl resin.

7. A radio-frequency magnetic field regulating device according to claim 4, in which said high molecular gel material is poly-vinyl alcohol.

8. A radio-frequency magnetic field regulating device according to claim 1, in which said substance has a property for growing a region where the flux density of a radio-frequency magnetic field near said member is increased.

9. For use in a magnetic resonance diagnostic apparatus which produces a magnetic resonance phenomenon in a specific region of a subject to be examined placed in a static magnetic field by irradiating said subject with an excitation radio-frequency pulse from a transmitting coil and collecting magnetic resonance signals produced by the magnetic resonance phenomenon by using a receiving coil, thereby obtaining diagnostic information on said specific region, a radio-frequency magnetic field regulating device comprising a member interposed between at least one of said transmitting and receiving coils and said subject to be examined and formed by molding a non-magnetic conductive metal into a predetermined shape with a molding material.

10. A radio-frequency magnetic field regulating device according to claim 9, in which said non-magnetic conductive metal is in the form of foil.

11. A radio-frequency magnetic field regulating device according to claim 9, in which said non-magnetic conductive metal is in the form of a mesh sheet for RF shielding.

12. A radio-frequency magnetic field regulating device according to claim 9, in which said molding material is a nonconductive fiber high molecular compound.

13. A radio-frequency magnetic field regulating device according to claim 9, in which said molding material is a rubber high molecular compound.

14. A radio-frequency magnetic field regulating device according to claim 9, in which said predetermined shape is the shape of a sheet.

15. For use in a magnetic resonance diagnostic apparatus which produces a magnetic resonance phenomenon in a specific region of a subject to be examined placed in a static magnetic field by irradiating said subject with an excitation radio-frequency pulse from a transmitting coil and collecting magnetic resonance signals produced by the magnetic resonance phenomenon by using a receiving coil, thereby obtaining diagnostic information on said specific region, a radio-frequency magnetic field regulating device comprising a member interposed between at least one of said transmitting and receiving coils and said subject to be examined and formed by filling a bag with a non-magnetic conductive gel material.

16. A radio-frequency magnetic field regulating device according to claim 15, in which said bag is formed of a high-molecular compound.

17. A radio-frequency magnetic field regulating device according to claim 15, in which said bag is formed of rubber.

18. A radio-frequency magnetic field regulating device according to claim 15, in which said non-magnetic conductive gel material is formed of a high-molecular compound impregnated with an inorganic electrolytic ion aqueous solution.

19. A radio-frequency magnetic field regulating device according to claim 18, in which said high molecular compound is poly-vinyl alcohol.

20. A radio-frequency magnetic field regulating device according to claim 18, in which said inorganic electrolytic ion aqueous solution contains at least one of $Na^+$, $K^+$, $Ca^{2+}$ or $Cl^-$.

21. For use in a magnetic resonance diagnostic apparatus which produces a magnetic resonance phenomenon in a specific region of a subject to be examined placed in a static magnetic field by irradiating said subject with an excitation radio-frequency pulse from a transmitting coil and collecting magnetic resonance signals produced by the magnetic resonance phenomenon by using a receiving coil, thereby obtaining diagnostic information on said specific region, a radio-frequency magnetic field regulating device comprising a bag interposed between at least one of said transmitting and receiving coils and said subject to be examined and filled with a high molecular compound impregnated with an inorganic electrolytic ion aqueous solution.

22. A radio-frequency magnetic field regulating device according to claim 21, in which said high molecular compound is a poly-acryl resin.

23. A radio-frequency magnetic field regulating device according to claim 21, in which said inorganic electrolytic ion aqueous solution contains at least one of $Na^+$, $K^+$, $Ca^{2+}$ or $Cl^-$.

* * * * *